US006774540B2

(12) United States Patent
Fukukita

(10) Patent No.: US 6,774,540 B2
(45) Date of Patent: Aug. 10, 2004

(54) SOUND CONVERTING APPARATUS

(75) Inventor: Hiroshi Fukukita, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 181 days.

(21) Appl. No.: 10/126,801

(22) Filed: Apr. 19, 2002

(65) Prior Publication Data

US 2002/0167249 A1 Nov. 14, 2002

(30) Foreign Application Priority Data

Apr. 24, 2001 (JP) ....................................... 2001-125510

(51) Int. Cl.[7] ................................................ H01L 41/08
(52) U.S. Cl. ....................................................... 310/334
(58) Field of Search ................................ 310/334, 358, 310/359, 366

(56) References Cited

U.S. PATENT DOCUMENTS

| | | | | |
|---|---|---|---|---|
| 4,890,268 A | * | 12/1989 | Smith et al. | 367/138 |
| 5,135,001 A | | 8/1992 | Sinofky | |
| RE35,011 E | * | 8/1995 | Wersing et al. | 310/334 |
| 5,629,578 A | * | 5/1997 | Winzer et al. | 310/334 |
| 5,757,727 A | * | 5/1998 | Hanafy et al. | 367/155 |
| 5,758,397 A | * | 6/1998 | Inoi et al. | 29/25.35 |
| 5,920,523 A | * | 7/1999 | Hanafy et al. | 367/140 |
| 5,938,612 A | * | 8/1999 | Kline-Schoder et al. | 600/459 |
| 6,603,240 B1 | * | 8/2003 | Kohno et al. | 310/334 |

FOREIGN PATENT DOCUMENTS

| | | |
|---|---|---|
| EP | 0 838 271 A | 4/1998 |
| EP | 0 938 143 A | 8/1999 |
| JP | S58-52557 | 3/1983 |

* cited by examiner

*Primary Examiner*—Mark Budd
(74) *Attorney, Agent, or Firm*—Pearne & Gordon LLP

(57) ABSTRACT

Herein disclosed is a sound converting apparatus for performing conversion between electric signals and ultrasonic waves, comprising: a plurality of oscillation bodies for emitting ultrasonic waves converted from the electric signals along a wave propagating direction Dp; and a plurality of electrically conductive bodies each for electrically connecting the oscillation bodies; a plurality of signal lines for inputting electric signals to be applied to respective oscillation bodies; a pair of external electrodes respectively held in contact with the outer surfaces of respective piezoelectric layers and electrically connected with the electrically conductive bodies; and a dividing electrode sandwiched by and held in contact with the inner surfaces of the piezoelectric layers and electrically connected with the signal line, whereby the piezoelectric layers respectively generate electric polarizations, directions of which are opposing to each other and extending substantially parallel to an azimuthal direction Da perpendicular to the wave propagating direction Dp, and emit ultrasonic waves converted from the electric signals along the wave propagating direction Dp when electrical fields are applied between the external electrodes and the dividing electrode in response to the electric signals, the ratio of the width W1 to the thickness T is within a range of from 0.1 to 0.8.

11 Claims, 7 Drawing Sheets

SOUND CONVERTING APPARATUS

BACKGROUND OF THE INVENTION

1. Field of the Invention

The present invention relates to a sound converting apparatus for performing conversion between electric signals and ultrasonic waves, and more particularly to a sound converting apparatus operable to perform conversion between electric signals and ultrasonic waves at a low voltage.

2. Description of the Related Art

In recent years, there have been proposed various kinds of sound converting apparatus for performing conversion between electric signals and ultrasonic waves, viz. converting electric signals into ultrasonic waves or converting ultrasonic waves into electric signals used, for example, to probe the internal orgasm of the human body to assist the doctors in diagnosing the human body in the hospitals.

One typical example of the conventional sound converting apparatus is disclosed in Japanese Patent Laid-Open Publication No. 299799/1999. The conventional sound converting apparatus 700 herein disclosed is shown in FIG. 7. The conventional sound converting apparatus 700 is adapted to emit ultrasonic waves converted from electric signals along a wave propagating direction Dp. The conventional sound converting apparatus 700 comprises a plurality of piezoelectric layers 76*a*, 76*b*, and 76*c*, each having a first surface and a second surface, and aligned one after another in a wave propagating direction Dp. The first and second surfaces of the piezoelectric layers 76*a*, 76*b*, and 76*c* are extending substantially parallel to an azimuthal direction Da perpendicular to the wave propagating direction Dp. The conventional sound converting apparatus 700 further comprises a plurality of electrodes, i.e., electrodes 77, 79, 80, and 78 aligned one after another along the wave propagating direction Dp. The electrode 77 is held in contact with the second surface of the piezoelectric layer 76*c*. The electrode 79 is sandwiched between the piezoelectric layers 76*c* and 76*b* and held in contact with the first surface of the piezoelectric layer 76*c* and the second surface of the piezoelectric layer 76*b*. The electrode 80 is sandwiched between the piezoelectric layers 76*b* and 76*a* and held in contact with the first surface of the piezoelectric layer 76*b* and the second surface of the piezoelectric layer 76*a*. The electrode 78 is held in contact with the first surface of the piezoelectric layer 76*a*. The conventional sound converting apparatus 700 further comprises an electrically conductive film 84 electrically connecting the electrode 77 with the electrode 80, and an electrically conductive film 85 electrically connecting the electrode 78 with the electrode 79. The conventional sound converting apparatus 700 further comprises a signal line 87 electrically connected with the electrode 77 and a signal line 88 electrically connected with the electrode 78. The signal lines 87 and 89 are operative to input an electrical signal to be applied to the piezoelectric layers 76*a*, 76*b*, and 76*c* to operate the conventional sound converting apparatus 700.

As described above, the conventional sound converting apparatus 700 comprising a plurality of electrodes aligned one after another in the wave propagating direction Dp makes it possible to increase the electrical field intensity of an electric signal to be applied to the piezoelectric layers in comparison with a conventional sound converting apparatus comprising a single piezoelectric layer in the wave propagating direction Dp. This means that the electrical field intensity of an electrical signal, i.e., an operating voltage to be applied to the piezoelectric layers of the conventional sound converting apparatus 700 can be less than the operating voltage to be applied to the piezoelectric layer of the conventional sound converting apparatus comprising a single piezoelectric layer in the wave propagating direction Dp. This leads to the fact that the conventional sound converting apparatus 700 is operative at an operating voltage less than the operating voltage which the conventional sound converting apparatus comprising a single piezoelectric layer in the wave propagating direction Dp is operative at.

The conventional sound converting apparatus 700 thus constructed as above described, however, encounters such a problem that the conventional sound converting apparatus 700 is required to comprise electrically conductive films 84 and 85 for electrically connecting the piezoelectric layers 76*a*, 76*b*, and 76*c*. The conventional sound converting apparatus 700 thus constructed encounters another problem that the conventional sound converting apparatus 700 is required to increase the number of piezoelectric layers to be aligned in the wave propagating direction Dp in order to increase the electrical field intensity of an electric signal to be applied to the piezoelectric layers of the conventional sound converting apparatus 700.

The present invention contemplates resolution of such problems.

SUMMARY OF THE INVENTION

It is therefore an object of the present invention to provide a sound converting apparatus which is not required to comprise electrically conductive films for electrically connecting the piezoelectric layers.

It is another object of the present invention to provide a sound converting apparatus which can increase the electrical field intensity of an electrical signal to be applied to the piezoelectric layers without increasing the number of piezoelectric layers to be aligned in the wave propagating direction Dp.

It is a further object of the present invention to provide a sound converting apparatus which is simple in construction and operative at an operating voltage less than a conventional sound converting apparatus.

In accordance with a first aspect of the present invention, there is provided a sound converting apparatus for performing conversion between electric signals and ultrasonic waves, comprising: a plurality of oscillation bodies for emitting ultrasonic waves converted from the electric signals along a wave propagating direction; and a plurality of electrically conductive bodies each for electrically connecting the oscillation bodies; a plurality of signal lines for inputting electric signals to be applied to respective oscillation bodies; each of the oscillation bodies including a pair of piezoelectric layers respectively having inner surfaces and outer surfaces, extending substantially parallel to the wave propagating direction, the inner surfaces of respective piezoelectric layers opposing to each other; a pair of external electrodes respectively held in contact with the outer surfaces of respective piezoelectric layers and electrically connected with the electrically conductive bodies; and a dividing electrode sandwiched by and held in contact with the inner surfaces of the piezoelectric layers and electrically connected with the signal line, whereby piezoelectric layers respectively generate electric polarizations, directions of which are opposing to each other and extending substantially parallel to an azimuthal direction perpendicular to the wave propagating direction, and emit ultrasonic waves converted from the electric signals along the wave propagating direction when electrical fields are applied between the external electrodes and the dividing electrode in response to the electric signals. In the aforesaid sound converting apparatus, each of the oscillation bodies has a width with respect to the azimuthal direction and a thickness with respect to the wave propagating direction, and the ratio of the width to the thickness is within a range of from 0.1 to 0.8. In the aforesaid sound converting apparatus, the piezoelectric layers may be disposed in mirror symmetric relationship with respect to the directions of electric polarizations and each of the electrically conductive bodies is operative to electrically connect two oscillation bodies neighboring in the azimuthal direction.

In accordance with a second aspect of the present invention, each of the oscillation bodies may be in the form of a trapezoidal shape in cross section taken on a plane extending substantially parallel to the wave propagating direction and the azimuthal direction. In the aforesaid sound converting apparatus, each of the oscillation bodies has a top surface and a base surface opposing to each other and extending substantially parallel to the azimuthal direction, each of the oscillation bodies has a top width along the top surface and a base width along the base surface with respect to the azimuthal direction, and both of the ratio of the top width to the thickness and the ratio of the base width to the thickness are within a range of from 0.1 to 0.8. In the aforesaid sound converting apparatus, each of the oscillation bodies has a base surface extending substantially parallel to the azimuthal direction, and which further comprises a supporting portion extending substantially parallel to the azimuthal direction, and held in contact with the base surfaces of the oscillation bodies to have the oscillation bodies mounted thereon. In the aforesaid sound converting apparatus, each of the oscillation bodies has a top surface extending substantially parallel to the azimuthal direction and opposite to the base surface, and which further comprises an acoustic matching layer extending substantially parallel to the azimuthal direction, and held in contact with the top surfaces of the oscillation bodies to be mounted on the oscillation bodies.

In accordance with a third aspect of the present invention, the oscillation bodies are one-dimensionally aligned one after another in the azimuthal direction for emitting ultrasonic waves converted from the electric signals along a wave propagating direction perpendicular to the azimuthal direction, and each of the electrically conductive bodies is operative to electrically connect two neighboring oscillation bodies. In the aforesaid sound converting apparatus, each of the oscillation bodies has a length with respect to a longitudinal direction perpendicular to the azimuthal direction and the wave propagating direction, and the oscillation bodies are aligned one after another in the azimuthal direction and in the longitudinal direction. In the aforesaid sound converting apparatus, the ratio of the length to the thickness is within a range of from 0.1 to 0.8. The piezoelectric layers may be made of a material whose transverse electromechanical coupling coefficient (k31) is equal to or more than 35%. Alternatively, the piezoelectric layers may be made of a material of lead zirconate titanate ceramics.

BRIEF DESCRIPTION OF THE DRAWINGS

The features and advantages of the ultrasonic probe according to the present invention will more clearly be understood from the following description taken in conjunction with the accompanying drawings in which.

DESCRIPTION OF THE PREFERRED EMBODIMENTS

Figure 1:
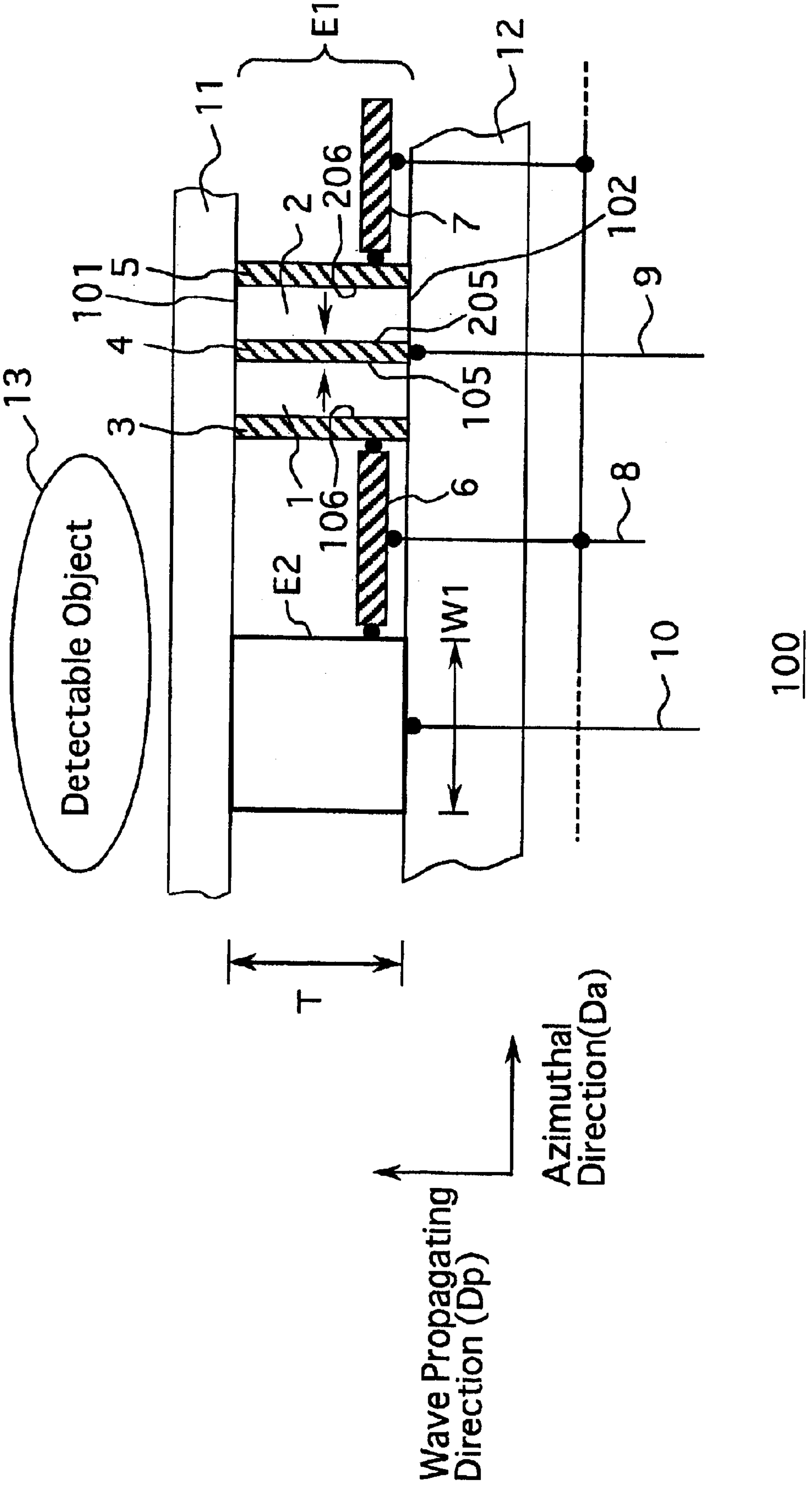
FIG. 1 is a cross-sectional view of a first embodiment of the sound converting apparatus 100 according to the present invention.

The following description will be directed to a plurality of preferred embodiments of the sound converting apparatus according to the present invention. Throughout the following detailed description, similar reference characters refer to similar elements in all figures of the drawings. Description about the similar elements and parts will be omitted to avoid tedious repetition.

A first embodiment of the sound converting apparatus 100 according to the present invention will now be described with reference to the drawings, in particular, to FIG. 1 to FIG. 4.

The first converting apparatus 100 is adapted to perform conversion between electric signals and ultrasonic waves, viz. converting electric signals into ultrasonic waves or converting ultrasonic waves into electric signals used, for example, to probe the internal orgasm of the human body to assist the doctors in diagnosing the human body in the hospitals.

The construction of the first embodiment of the sound converting apparatus 100 according to the present invention will be firstly described.

The sound converting apparatus 100 is shown in FIG. 1 as comprising a plurality of oscillation bodies E1, E2 for emitting ultrasonic waves converted from the electric signals along a wave propagating direction Dp and a plurality of electrically conductive bodies 6,7 for electrically connecting the oscillation bodies E1, E2, and a plurality of signal lines 9, 10 for inputting electric signals to be applied to respective oscillation bodies E1, E2. In this connection, it is noted that the oscillation bodies constituting the sound converting apparatus 100 are identical to one another. Therefore, the oscillation bodies E1, E2 refer to any one of the oscillation bodies constituting the sound converting apparatus 100.

As best shown in FIG. 1, each of the oscillation bodies E1, E2 includes a pair of piezoelectric layers 1, 2 respectively having inner surfaces 105, 205 and outer surfaces 106, 206, extending substantially parallel to the wave propagating direction Dp. The inner surfaces 105, 205 of respective piezoelectric layers 1, 2 are opposing to each other. The piezoelectric layers 1, 2 may be made of a piezoelectric ceramic with a high transverse electromechanical coupling coefficient, k31. Preferably, the piezoelectric layers 1, 2 may be made of a material of lead zirconate titanate ceramics, for example, $Pb(Zr,Ti)O_3$. Alternatively, the piezoelectric layers 1, 2 may be made of a material whose transverse electromechanical coupling coefficient, viz., k31 is equal to or more than 35%. Here, the transverse electromechanical coupling coefficient, viz. the term k31 is intended to mean an electromechanical coupling coefficient of the transverse mode. The electromechanical coupling coefficient, k is intended to mean the efficiency with which energy is interconverted between mechanical and electrical forms in the material. The ratio of the stored converted energy to the input energy is defined as the square of the electromechanical coupling coefficient as follows.

$$k^2 = \frac{\text{(stored converted energy)}}{\text{(input energy)}}$$

The sound converting apparatus 100 further comprises a pair of external electrodes 3, 5 respectively held in contact with the outer surfaces 106, 206 of respective piezoelectric layers 1, 2 and electrically connected with the electrically conductive bodies 6, 7; and a dividing electrode 4 sandwiched by and held in contact with the inner surfaces 105, 205 of the piezoelectric layers 1, 2 and electrically connected with the signal line 9.

The piezoelectric layers 1, 2 are respectively adapted to generate electric polarizations and emit ultrasonic waves converted from the electric signals along the wave propagating direction Dp when electrical fields are applied between the external electrodes 3, 5 and the dividing electrode 4 in response to the electric signals. The directions of the electric polarizations thus generated are opposing to each other and extending substantially parallel to an azimuthal direction Da perpendicular to the wave propagating direction Dp. Preferably, the piezoelectric layers 1, 2 are disposed in mirror symmetric relationship with respect to the directions of electric polarizations so as to be excited in phase with each other when the electrical fields are applied between the external electrodes 3, 5 and the dividing electrode 4.

Furthermore, each of the oscillation bodies E1, E2 has a width W1 with respect to the azimuthal direction Da and a thickness T with respect to the wave propagating direction Dp. Preferably, the ratio of the width WI to the thickness T is within a range of from 0.1 to 0.8.

Each of the oscillation bodies E1, E2 has a base surface 102 extending substantially parallel to the azimuthal direction Da. The sound converting apparatus 100 further comprises a supporting portion 12 extending substantially parallel to the azimuthal direction Da, and held in contact with the base surfaces of the oscillation bodies E1, E2 to have the oscillation bodies E1, E2 mounted thereon. The supporting portion 12 is adapted to enhance the frequency characteristics of the sound converting apparatus 100.

Each of the oscillation bodies E1 has a top surface 101 extending substantially parallel to the azimuthal direction Da and opposite to the base surface 102. The sound converting apparatus 100 further comprises an acoustic matching layer 11 extending substantially parallel to the azimuthal direction Da, and held in contact with the top surfaces of the oscillation bodies E1, E2 to be mounted on the oscillation bodies E1, E2. The acoustic matching layer 11 is adapted to improve the efficiency of conversion between electric signals and ultrasonic waves and the frequency characteristics of the sound converting apparatus 100. The detectable object 13 is disposed on the side of the acoustic matching layer 11 of the sound converting apparatus 100 in the wave propagating direction Dp.

The sound converting apparatus 100 thus constructed is adapted to probe a detectable object 13 with the ultrasonic waves emitted to the detectable object 13 in response to the electric signals and with ultrasonic echo from the detectable object 13.

The operation of the first embodiment of the sound converting apparatus 100 according to the present invention will be described hereinlater.

The signal lines 9, 10 have electric signals inputted therethrough to be applied to respective oscillation bodies E1, E2. The dividing electrode 4 is operated to apply the electric signals to the piezoelectric layers 1, 2.

The piezoelectric layers 1, 2 are then respectively operated to generate electric polarizations and emit ultrasonic waves converted from the electric signals along the wave propagating direction Dp when electrical fields are applied between the external electrodes 3, 5 and the dividing electrode 4 in response to the electric signals. The directions of the electric polarizations thus generated are opposing to each other and extending substantially parallel to an azimuthal direction Da perpendicular to the wave propagating direction Dp. This means that the piezoelectric layers 1, 2 disposed in mirror symmetric relationship with respect to the directions of electric polarizations are operated to be excited in phase with each other to emit ultrasonic waves in the direction of the wave propagating direction Dp through the acoustic matching layer 11 to the detectable object 13.

Each of the oscillation bodies E1, E2 is operated to emit the ultrasonic waves and to receive the ultrasonic echo from the detectable object 13 such as intestinal orgasm being observed while the electrical signals are inputted through the signal lines 8, 10.

Figure 2:
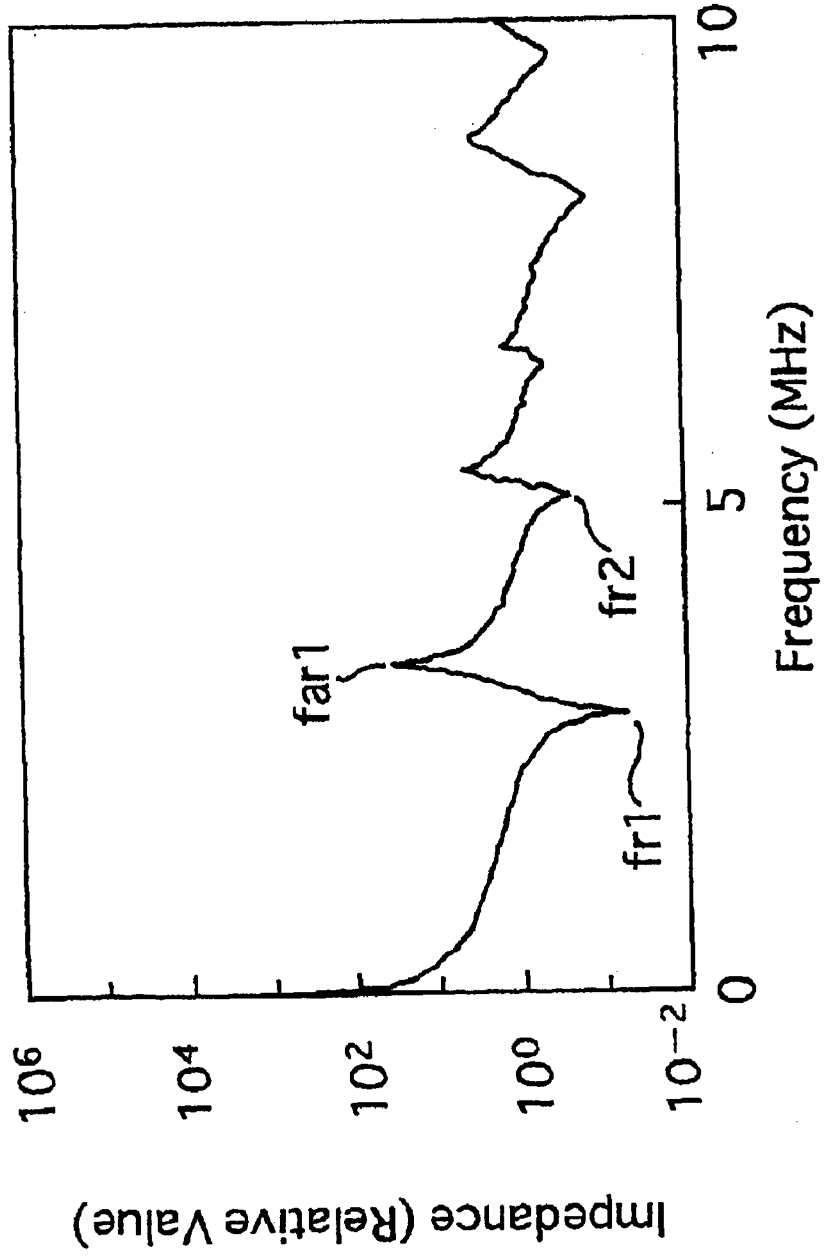
FIG. 2 is a graph showing characteristics of the resonance frequencies of the first embodiment of the sound converting apparatus 100 shown in FIG. 1.

Referring to FIG. 2 of the drawings, there are depicted the absolute values of the impedance of an oscillation body E1 varied in response to the frequency of the ultrasonic waves to show the characteristics of the resonance frequencies of the first embodiment of the sound converting apparatus 100 according to the present invention. In FIG. 2, it is assumed that the width W1 of the oscillation body along the azimuthal direction Da is set at 0.24 millimeter, the thickness T of the oscillation body E1 along the wave propagating direction Dp is set at 0.48 millimeter, and the ratio of the width W1 to the thickness T is equal to 0.5. The vertical coordinate axis represents the relative value of the absolute impedance of the oscillation body and the horizontal coordinate axis represents the frequency of the ultrasonic waves.

The oscillation body is effectively excited to emit ultrasonic waves along the wave propagating direction Dp at 2.91 MHz, which is a resonance frequency fr1 of the oscillation body. The oscillation body, on the other hand, is least excited to emit ultrasonic waves Dp at 3.43 MHz, which is an anti-resonance frequency far1 of the oscillation body. The transverse electromechanical coupling coefficient k31 of the piezoelectric layers 1, 2 is equal to 57%. The oscillation body is again effectively excited to emit ultrasonic waves along the azimuthal direction Da at another resonance frequency fr2.

As the ratio of the width W1 to the thickness T becomes closer to 1, values of the resonance frequencies fr1 and fr2 approach to each other, thereby narrowing the frequency range between the resonance frequency fr1 and the resonance frequency fr2 at which the oscillation body is effectively excited to emit ultrasonic waves along the wave propagating direction Dp. As the ratio of the width W1 to the thickness T, on the other hand, becomes equal to or lower than, for example, approximately 0.8, the values of the resonance frequencies fr1 and fr2 shown in FIG. 2 separate from each other, thereby making it possible to broaden the frequency range between the resonance frequency fr1 and the resonance frequency fr2 at which the oscillation body is effectively excited to emit ultrasonic waves along the wave propagating direction Dp. Furthermore, as the ratio of the width W1 to the thickness T becomes less than 0.1, the rigidity of the oscillation body against the oscillation is decreased and the stability of the oscillation body is sacrificed.

From foregoing description, it is to be understood that the sound converting apparatus 100 according to the present invention in which the ratio of the width W1 to the thickness T is within a range of from 0.1 to 0.8 can emit ultrasonic waves along the wave propagating direction Dp in response to frequencies of the broad range. This means that width W1 of the oscillation body is preferably equal to or lower than the thickness T of the oscillation body multiplied by 0.8, but not less than the thickness T of the oscillation body multiplied by 0.1 in accordance with the ratio of the width WI to the thickness T which is within a range of from 0.1 to 0.8.

In the sound converting apparatus 100 according to the present invention, the intensity of electrical fields to be applied to the piezoelectric layer 1 varies inversely with the distance between the external electrode 3 and the dividing electrode 4. This means that that the intensity of electrical fields to be applied to the oscillation body E1 can be increased by narrowing the width of each of the piezoelectric layers in the oscillation body instead of increasing the number of piezoelectric layers to be aligned in the wave propagating direction Dp. As described above, the width W1 of the oscillation body is preferably equal to or lower than the thickness T of the oscillation body multiplied by 0.8, but not less than the thickness T of the oscillation body multiplied by 0.1, in accordance with the ratio of the width W1 to the thickness T which is within a range of from 0.1 to 0.8. This leads to the fact that the intensity of electric field to be applied to the oscillation body E1 can be increased by narrowing the width of the oscillation body to a value equal to or lower than the thickness T of the oscillation body multiplied by 0.8, but not less than the thickness T of the oscillation body multiplied by 0.1 in accordance with the ratio of the width W1 to the thickness T which is within a range of from 0.1 to 0.8.

The sound converting apparatus 100 thus constructed is operated to probe a detectable object 13 with the ultrasonic waves emitted to the detectable object 13 in response to the electric signals and with ultrasonic echo from the detectable object 13.

From the foregoing description, it is also to be understood that the sound converting apparatus 100 according to the present invention comprises a plurality of electrically conductive bodies 6,7 for electrically connecting the oscillation bodies E1, E2, thereby eliminating the need to comprise electrically conductive films for electrically connecting the piezoelectric layers 1, 2.

In the sound converting apparatus 100 thus constructed, the electrical field intensity of an electrical signal, i.e., an operating voltage to be applied to the piezoelectric layers can be reduced. This means that the sound converting apparatus 100 is simple in construction and operative at an operating voltage less than a conventional sound converting apparatus.

Figure 3:
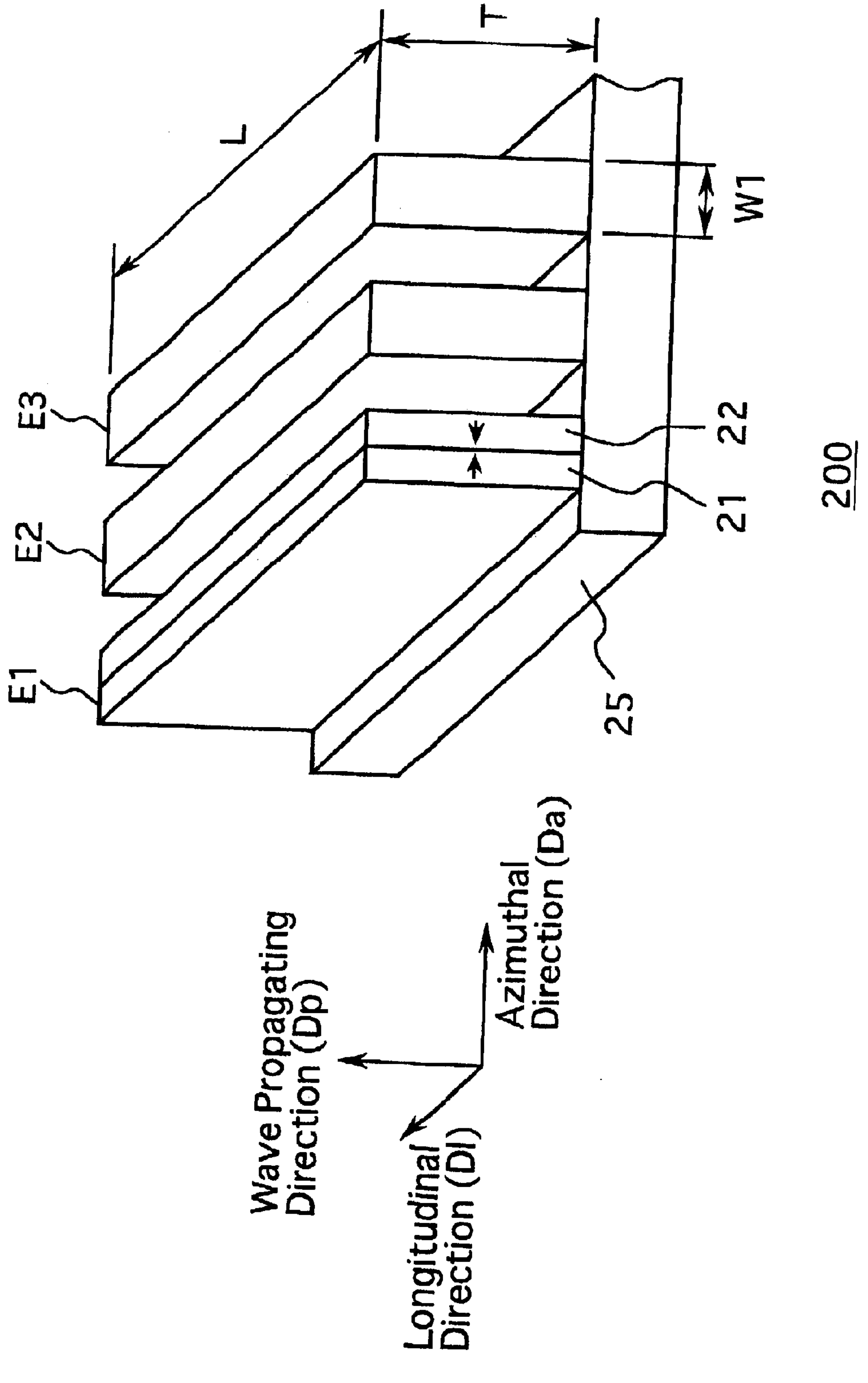
FIG. 3 is a schematic view of an example of the first embodiment of the sound converting apparatus 200 shown in FIG. 1.

Referring to FIG. 3 of the drawings, there is shown an example of the first embodiment of the sound converting apparatus 200 comprising a plurality of oscillation bodies in the azimuthal direction Da. As best shown in FIG. 3, the sound converting apparatus 200 comprises a plurality of oscillation bodies E1, E2, E3 one-dimensionally aligned one after another in the azimuthal direction Da and a plurality of electrically conductive bodies 6,7, not shown, for electrically connecting the oscillation bodies E1, E2, E3. In the oscillation body E1, the piezoelectric layers 21, 22 are in the form of a rectangular parallelepiped shape.

The piezoelectric layers 21, 22 respectively generate electric polarizations when electrical fields are applied. The directions of the electric polarizations thus generated are opposing to each other and extending along the azimuthal direction Da. The piezoelectric layers 21, 22 are disposed in mirror symmetric relationship with respect to the directions of electric polarizations so as to be excited in phase with each other when the electric fields are applied.

Each of the oscillation bodies E1, E2, E3 has a width W1 with respect to the azimuthal direction Da and a thickness T with respect to the wave propagating direction Dp. Preferably, the ratio of the width W1 to the thickness T is within a range of from 0.1 to 0.8.

The sound converting apparatus 200 thus constructed is operable in the same manner as the sound converting apparatus 100 shown in FIG. 1.

As described above, the sound converting apparatus 200 according to the present invention comprises a plurality of oscillation bodies E1, E2, E3 one-dimensionally aligned one after another in the azimuthal direction Da and a plurality of electrically conductive bodies, thereby making it possible to illuminate the need to comprise electrically conductive films for electrically connecting the piezoelectric layers and increase the electrical field intensity of an electrical signal to be applied to the piezoelectric layers without increasing the number of piezoelectric layers to be aligned in the wave propagating direction Dp.

In the sound converting apparatus 200 comprising a plurality of oscillation bodies one-dimensionally aligned one after another in the azimuthal direction Da, the electrical field intensity of an electrical signal, i.e., an operating voltage to be applied to the piezoelectric layers can be reduced. This means that the sound converting apparatus 200 is simple in construction and operative at an operating voltage less than a conventional sound converting apparatus.

In order to attain the objects of the present invention, the above first embodiment of the sound converting apparatus 200 may be replaced by a second embodiment of the sound converting apparatus 300, which will be described hereinlater.

Figure 4:
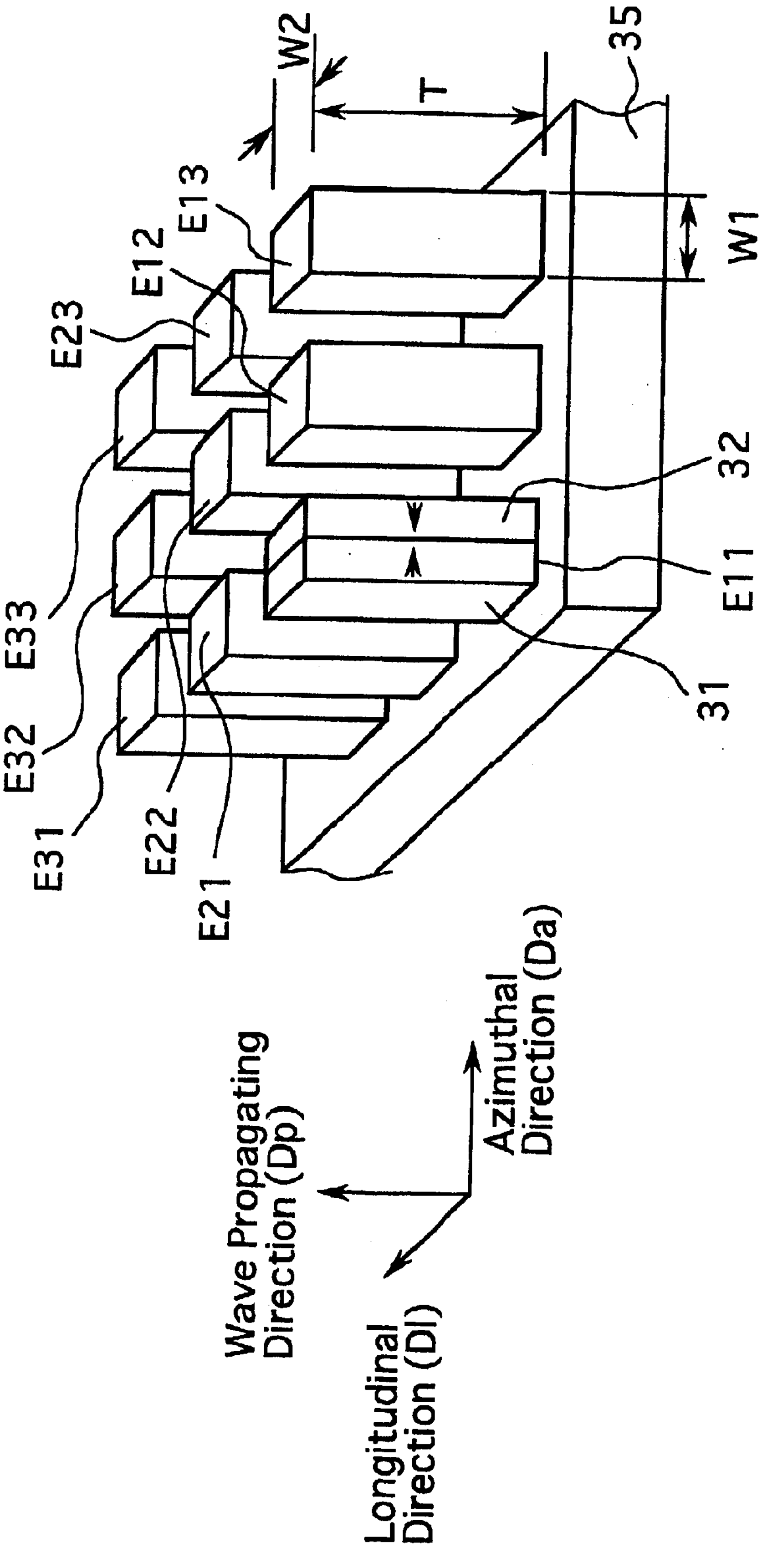
FIG. 4 is a schematic view of a second embodiment of the sound converting apparatus 300 shown in FIG. 1.

Referring to FIG. 4 of the drawings, there is shown a second embodiment of the sound converting apparatus 300 according to the present invention. The second embodiment of the sound converting apparatus 300 is similar in construction to the sound converting apparatus 200 except for the fact that each of the oscillation bodies in the sound converting apparatus 300 has a length W2 with respect to a longitudinal direction perpendicular D1 to the azimuthal direction Da and the wave propagating direction Dp and two-dimensionally aligned one after another in the azimuthal direction Da and in the longitudinal direction D1.

As best shown in FIG. 4, each of the oscillation bodies E11, E12, . . . in the sound converting apparatus 300 has a length W2 with respect to a longitudinal direction perpendicular D1 to the azimuthal direction Da and the wave propagating direction Dp. The oscillation bodies E11, D12, . . . are two-dimensionally aligned one after another in the azimuthal direction Da and in the longitudinal direction D1, and each of the electrically conductive bodies, not shown, is operative to electrically connect two neighboring oscillation bodies E11, E12, . . . In this connection, it is noted that the oscillation bodies constituting the sound converting apparatus 300 are identical to one another. Therefore, the oscillation bodies E11, E12, . . . refer to any one of the oscillation bodies constituting the sound converting apparatus 300.

Each of the oscillation bodies E11 . . . includes a pair of piezoelectric layers. The piezoelectric layers 31, 32 respectively generate electric polarizations when electrical fields are applied. The directions of the electric polarizations thus generated are opposing to each other and extending along the azimuthal direction Da. The piezoelectric layers 31, 32 are disposed in mirror symmetric relationship with respect to the directions of electric polarizations so as to be excited in phase with each other when the electric fields are applied. Each of the electrically conductive bodies, not shown, is operative to electrically connect two oscillation bodies E11, E12, . . . neighboring in the azimuthal direction Da.

Furthermore, each of the oscillation bodies E11, E12, . . . has a width W1 with respect to the azimuthal direction Da and a thickness T with respect to the wave propagating direction Dp, and the ratio of the width W1 to the thickness T is within a range of from 0.1 to 0.8. Preferably, the ratio of the length W2 to the thickness T is within a rage of from 0.1 to 0.8.

Similar to the sound converting apparatus 100, each of the oscillation bodies E11, E12, . . . has a base surface extending substantially parallel to the azimuthal direction Da. The sound converting apparatus 300 further comprises a supporting portion 35 extending substantially parallel to the azimuthal direction Da, and held in contact with the base surfaces of the oscillation bodies E11, E12, . . . to have the oscillation bodies E11, E12, . . . mounted thereon. The supporting portion 35 is adapted to enhance the frequency characteristics of the sound converting apparatus 300.

Similar to the sound converting apparatus 100, each of the oscillation bodies E11, E12, . . . has a top surface extending substantially parallel to the azimuthal direction Da and opposite to the base surface 25. The sound converting apparatus 100 may further comprise an acoustic matching layer, not shown, extending substantially parallel to the azimuthal direction Da, and held in contact with the top surfaces of the oscillation bodies E11, E12, . . . to be mounted on the oscillation bodies E11, E12, . . . The acoustic matching layer is adapted to improve the efficiency of conversion between electric signals and ultrasonic waves and the frequency characteristics of the sound converting apparatus 300.

The sound converting apparatus 300 thus constructed is operable in the same manner as the sound converting apparatus 100 shown in FIG. 1.

As described above, the sound converting apparatus 300 according to the present invention comprises a plurality of oscillation bodies two-dimensionally aligned one after another in the azimuthal direction Da and in the longitudinal direction D1, and a plurality of electrically conductive bodies each electrically connecting two neighboring oscillation bodies E11, E12, in which the ratio of the width W1 to the thickness T is within a range of from 0.1 to 0.8, and the ratio of the length W2 to the thickness T is within a range of from 0.1 to 0.8, thereby making it possible to illuminate the need to comprise electrically conductive films for electrically connecting the piezoelectric layers and increase the electrical field intensity of an electrical signal to be applied to the piezoelectric layers without increasing the number of piezoelectric layers to be aligned in the wave propagating direction Dp.

In the sound converting apparatus 300 thus constructed, the electrical field intensity of an electrical signal, i.e., an operating voltage to be applied to the piezoelectric layers can be reduced. This means that the sound converting apparatus 300 is simple in construction and operative at an operating voltage less than a conventional sound converting apparatus.

In order to attain the objects of the present invention, the above first embodiment of the sound converting apparatus 100 may be replaced by a third embodiment of the sound converting apparatus 400, which will be described hereinlater.

Figure 5:
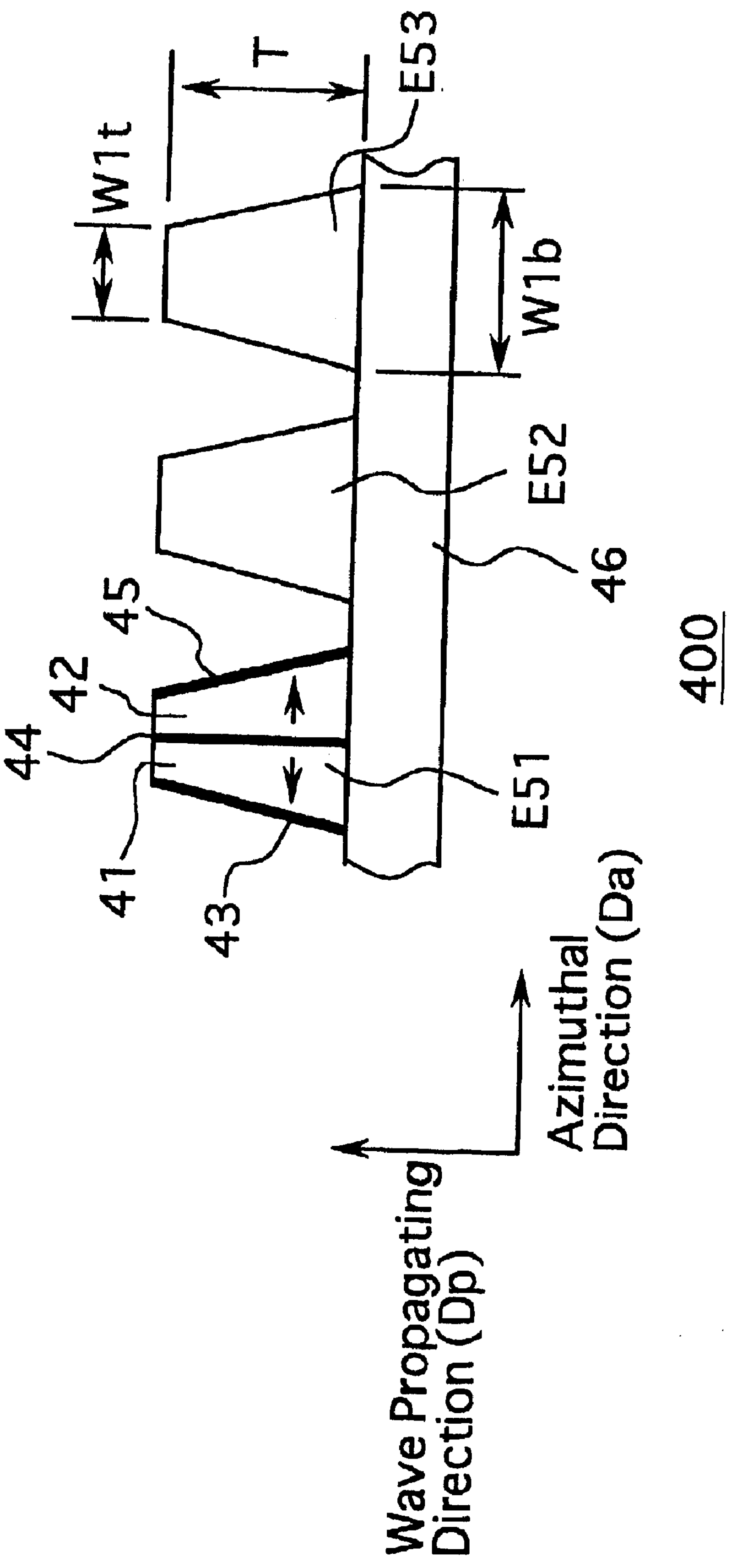
FIG. 5 is a cross-sectional view of a third embodiment of the sound converting apparatus 400 according to the present invention.

Referring to FIG. 5 of the drawings, there is shown a third embodiment of the sound converting apparatus 400 according to the present invention. The third embodiment of the sound converting apparatus 400 is similar in construction to the sound converting apparatus 100 except for the fact that each of oscillation bodies is in the form of a trapezoidal shape in cross section taken on a plane extending substantially parallel to the wave propagating direction Dp and the azimuthal direction Da.

As best shown in FIG. 5, each of the oscillation bodies E51, E52, E53 is in the form of a trapezoidal shape in cross section taken on a plane extending substantially parallel to the wave propagating direction Dp and the azimuthal direction Da. In this connection, it is noted that the oscillation bodies constituting the sound converting apparatus 400 are identical to one another. Therefore, the oscillation bodies E51, E52, E53 refer to any one of the oscillation bodies constituting the sound converting apparatus 400. Each of the oscillation bodies E51, E52 has a top surface and a base surface opposing to each other and extending substantially parallel to the azimuthal direction Da. Each of the oscillation bodies E51, E52 has a top width W1*t* along the top surface and a base width W1*b* along the base surface with respect to the azimuthal direction Da. Preferably, both of the ratio of the top width W1*t* to the thickness T and the ratio of the base width W1*b* to the thickness T are within a range of from 0.1 to 0.8.

Each of the oscillation bodies E51 includes a pair of piezoelectric layers 41, 42. The piezoelectric layers 41, 42 respectively generate electric polarizations when electrical fields are applied. The directions of the electric polarizations thus generated are opposing to each other and extending along the azimuthal direction Da. The piezoelectric layers 41, 42 are disposed in mirror symmetric relationship with respect to the directions of electric polarizations so as to be excited in phase with each other when the electric fields are applied. Each of the electrically conductive bodies, not shown, is operative to electrically connect two oscillation bodies neighboring in the azimuthal direction Da.

Similar to the sound converting apparatus 100, the sound converting apparatus 400 further comprises a supporting portion 46 extending substantially parallel to the azimuthal direction Da held in contact with the base surfaces of the oscillation bodies E51, E52, E53, . . . to have the oscillation bodies E51, E52, E53, . . . mounted thereon. The supporting portion 46 is adapted to enhance the frequency characteristics of the sound converting apparatus 400.

Similar to the sound converting apparatus 100, the sound converting apparatus 100 may further comprise an acoustic matching layer, not shown, extending substantially parallel to the azimuthal direction Da, and held in contact with the top surfaces of the oscillation bodies E51, E52, E53, . . . to be mounted on the oscillation bodies E11, E12, . . . The acoustic matching layer is adapted to improve the efficiency of conversion between electric signals and ultrasonic waves and the frequency characteristics of the sound converting apparatus 400.

The sound converting apparatus 400 thus constructed is operable in the similar manner as the sound converting apparatus 100 shown in FIG. 1.

Figure 6:
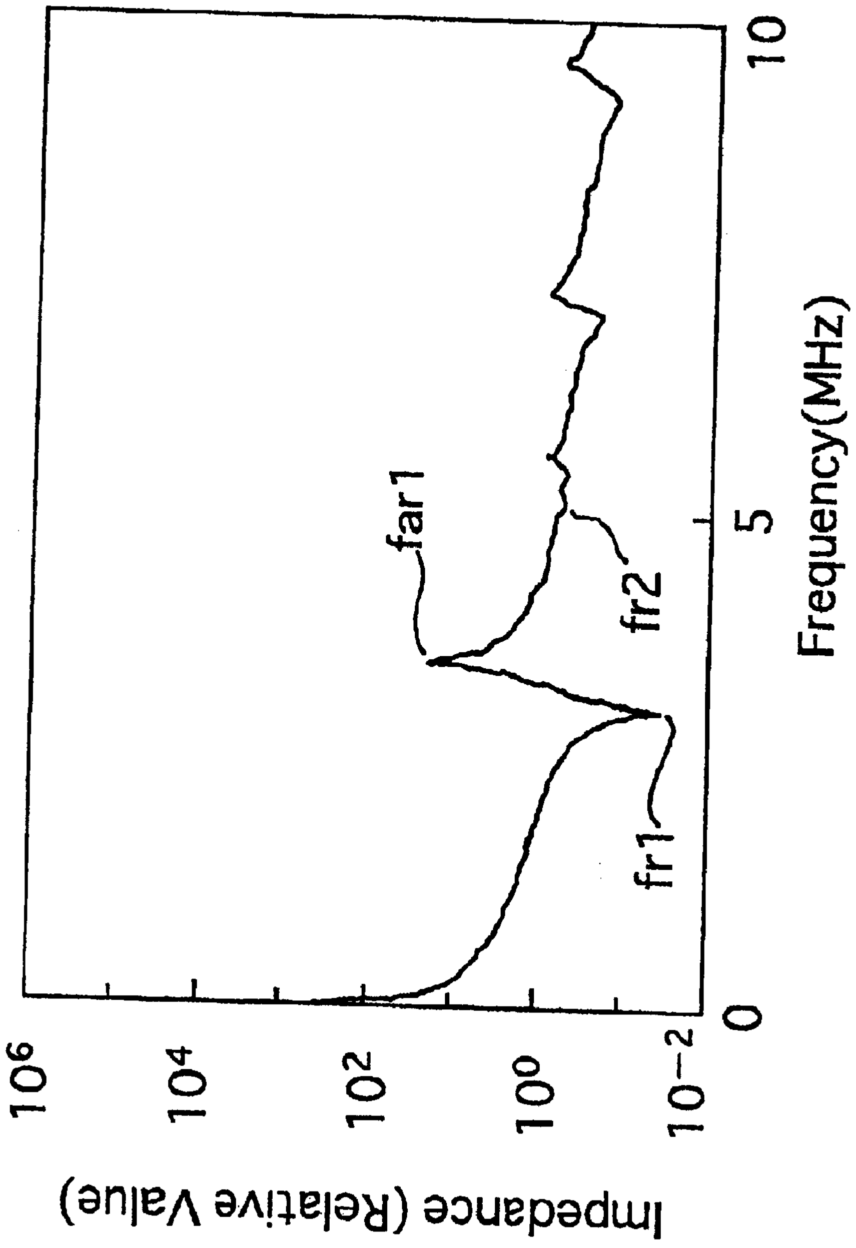
FIG. 6 is a graph showing characteristics of the resonance frequencies of the third embodiment of the sound converting apparatus 400 shown in FIG. 5.
Figure 7:
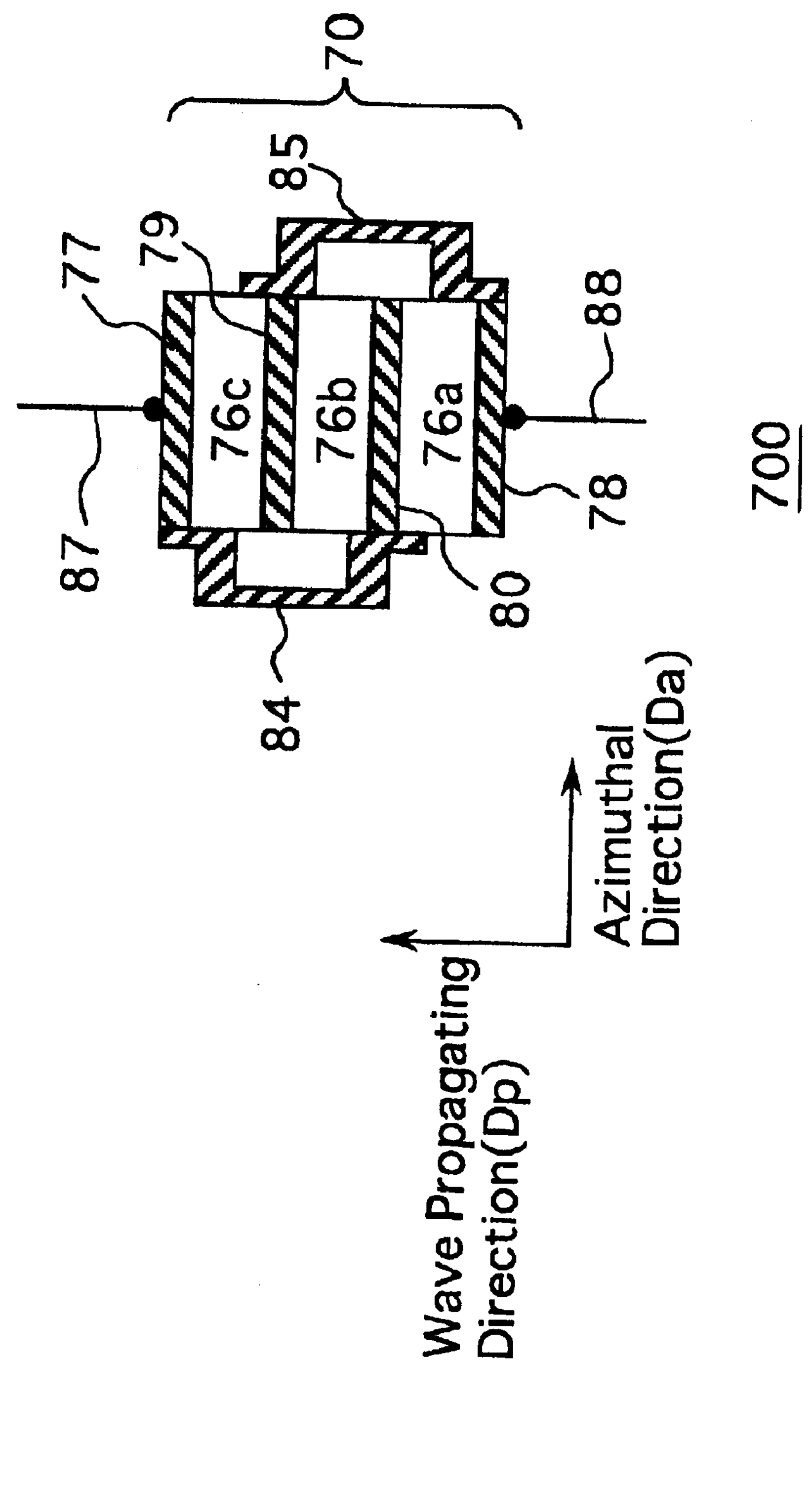
FIG. 7 Prior Art
FIG. 7 is a cross-sectional view of a conventional sound converting apparatus 700.

Referring to FIG. 6 of the drawings, there are depicted the absolute values of the impedance of an oscillation body varied in response to the frequency of the ultrasonic waves to show the characteristics of the resonance frequencies of the third embodiment of the sound converting apparatus 400 according to the present invention. In FIG. 6, it is assumed that the top width W1*t* of the oscillation body along the top surface and the base width W1*b* of the oscillation body along the base surface with respect to the azimuthal direction Da are 0.12 millimeter and 0.24 millimeter, respectively. The thickness T of the oscillation body along the wave propagating direction Dp is 0.48 millimeter. This means that the ratio of the top width W1*t* to the thickness T is 0.25 and the ratio of the base width W1*b* to the thickness T is 0.5. The vertical coordinate axis represents the relative value of the absolute impedance of the oscillation body and the horizontal coordinate axis represents the frequency of the ultrasonic waves. As described above, the values of the resonance frequencies fr1 and fr2 separate from each other because of the fact that the ratio of the top width W1*t* to the thickness T is 0.25 and the ratio of the base width W1*b* to the thickness T is 0.5, viz., the ratio of the top width W1*t* to the thickness T and the ratio of the base width W1*b* to the thickness T are within a range of from 0.1 to 0.8.

The oscillation body is excited to emit ultrasonic waves along the wave propagating direction Dp. at 3.00 MHz, which is a resonance frequency fr1 of the oscillation body. The oscillation body, on the other hand, is least excited to emit ultrasonic waves along the wave propagating direction Dp at an anti-resonance frequency far1 of the oscillation body. The oscillation body is supposed to be again effectively excited to emit ultrasonic waves at another resonance frequency fr2 while the absolute impedance of the oscillation body remains almost unchanged at the resonance frequency fr2 as shown in FIG. 6.

The fact that the absolute impedance of the oscillation body remains almost unchanged around the resonance frequency fr2 is attributed to the fact that the width of the oscillation body with respect to the azimuthal direction Da changes along the wave propagating direction Dp from the top width W1*t* to the base width W1*b*.

Furthermore, both of the ratio of the top width W1*t* to the thickness T and the ratio of the base width W1*b* to the thickness T are within a range of from 0.1 to 0.8, thereby making it possible to broaden the frequency range between the resonance frequency fr1 and the resonance frequency fr2 at which the oscillation body is effectively excited to emit ultrasonic waves along the wave propagating direction Dp.

From the foregoing description, it is to be understood that the sound converting apparatus 400 according to the present invention, in which each of the oscillation bodies is in the form of a trapezoidal shape in cross section taken on a plane extending substantially parallel to the wave propagating direction Dp and the azimuthal direction Da, both of the ratio of the top width W1*t* to the thickness T and the ratio of the base width W1*b* to the thickness T are within a range of from 0.1 to 0.8 and the values of the resonance frequencies fr1 and fr2 separate from the value of each other, can broaden the frequency range between the resonance frequency fr1 and the resonance frequency fr2 at which the oscillation body is effectively excited to emit ultrasonic waves along the wave propagating direction Dp and remain the absolute impedance of the oscillation bodies almost unchanged around the resonance frequency fr2, thereby making it possible to emit ultrasonic waves along the wave propagating direction Dp in response to frequencies of the broad range. As described above, the top width W1*t* and base width W1*b* of the oscillation body are preferably equal to or lower than the thickness T of the oscillation body multiplied by 0.8, but not less than the thickness T of the oscillation body multiplied by 0.1 in accordance with the ratio of the top width W1*t* to the thickness T and the ratio of the base width W1*b* to the thickness T which are within a ratio of from 0.1 to 0.8. This leads to the fact that the intensity of electric field to be applied to the oscillation body E1 can be increased by narrowing the top width W1*t* and the base width W1*b* of the oscillation body to a value equal to or lower than the thickness T of the oscillation body multiplied by 0.8.

As described above, the sound converting apparatus 400 according to the present invention comprises a plurality of oscillation bodies E51, E52, E53 aligned one after another in the azimuthal direction Da and a plurality of electrically conductive bodies each electrically connecting the oscillation bodies E51, E52, E53, thereby making it possible to illuminate the need to comprise electrically conductive films for electrically connecting the piezoelectric layers and increase the electrical field intensity of an electrical signal to be applied to the piezoelectric layers without increasing the number of piezoelectric layers to be aligned in the wave propagating direction Dp.

In the sound converting apparatus 400 thus constructed, the electrical field intensity of an electrical signal, i.e., an operating voltage to be applied to the piezoelectric layers can be reduced. This means that the sound converting apparatus 200 is simple in construction and operative at an operating voltage less than a conventional sound converting apparatus.

Although the particular embodiment of the present invention has been shown and described, it will be obvious to those skilled in the art that various changes and modifications may be made without departing from the spirit and scope of the present invention.

What is claimed is:

1. Sound converting apparatus for performing conversion between electric signals and ultrasonic waves, comprising:

a plurality of oscillation bodies for emitting ultrasonic waves converted from said electric signals along a wave propagating direction; and a plurality of electrically conductive bodies each for electrically connecting said oscillation bodies;

a plurality of signal lines for inputting electric signals to be applied to respective oscillation bodies;

each of said oscillation bodies including a pair of piezoelectric layers respectively having inner surfaces and outer surfaces, extending substantially parallel to said wave propagating direction, said inner surfaces of respective piezoelectric layers opposing to each other;

a pair of external electrodes respectively held in contact with said outer surfaces of respective piezoelectric layers and electrically connected with said electrically conductive bodies; and a dividing electrode sandwiched by and held in contact with said inner surfaces of said piezoelectric layers and electrically connected with said signal line, whereby said piezoelectric layers respectively generate electric polarizations, directions of which are opposing to each other and extending substantially parallel to an azimuthal direction perpendicular to said wave propagating direction, and emit ultrasonic waves converted from said electric signals along said wave propagating direction when electrical fields are applied between said external electrodes and said dividing electrode in response to said electric signals, and each of said oscillation bodies has a width with respect to said azimuthal direction and a thickness with respect to said wave propagating direction, and the ratio of said width to said thickness is within a range of from 0.1 to 0.8.

2. Sound converting apparatus as set forth in claim 1, in which said piezoelectric layers disposed in mirror symmetric relationship with respect to said directions of electric polarizations and each of said electrically conductive bodies is operative to electrically connect two oscillation bodies neighboring in said azimuthal direction.

3. Sound converting apparatus for performing conversion between electric signals and ultrasonic waves, comprising:

a plurality of oscillation bodies for emitting ultrasonic waves converted from said electric signals along a wave propagating direction; and a plurality of electrically conductive bodies each for electrically connecting said oscillation bodies;

a plurality of signal lines for inputting electric signals to be applied to respective oscillation bodies;

each of said oscillation bodies including a pair of piezoelectric layers respectively having inner surfaces and outer surfaces, extending substantially parallel to said wave propagating direction, said inner surfaces of respective piezoelectric layers opposing to each other;

a pair of external electrodes respectively held in contact with said outer surfaces of respective piezoelectric layers and electrically connected with said electrically conductive bodies; and a dividing electrode sandwiched by and held in contact with said inner surfaces of said piezoelectric layers and electrically connected with said signal line, whereby said piezoelectric layers respectively generate electric polarizations, directions of which are opposing to each other and extending substantially parallel to an azimuthal direction perpendicular to said wave propagating direction, and emit ultrasonic waves converted from said electric signals along said wave propagating direction when electrical fields are applied between said external electrodes and said dividing electrode in response to said electric signals, and each of said oscillation bodies is in the form of a trapezoidal shape in cross section taken on a plane extending substantially parallel to said wave propagating direction and said azimuthal direction.

4. Sound converting apparatus for performance conversion between electric signals and ultrasonic waves, comprising:

a plurality of oscillation bodies for emitting ultrasonic waves converted from said electric signals along a wave propagating direction; and a plurality of electrically conductive bodies each for electrically connecting said oscillation bodies;

a plurality of signal lines for inputting electric sianals to be applied to respective oscillation bodies;

each of said oscillation bodies including a pair of piezoelectric layers respectively having inner surfaces and outer surfaces, extending substantially parallel to said wave propagating direction, said inner surfaces of respective piezoelectric layers opposing to each other;

a pair of external electrodes respectively held in contact with said outer surfaces of respective piezoelectric layers and electrically connected with said electrically conductive bodies; and a dividing electrode sandwiched by and held in contact with said inner surfaces of said piezoelectric layers and electrically connected with said signal line, whereby said piezoelectric layers respectively generate electric polarizations, directions of which are opposing to each other and extending substantially parallel to an azimuthal direction perpendicular to said wave propagating direction, and emit ultrasonic waves converted from said electric signals along said wave propagating direction when electrical fields are applied between said external electrodes and said dividing electrode in response to said electric signals, each of said oscillation bodies is in the form of a trapezoidal shape in cross section taken on a plane extending substantially parallel to said wave propagating direction and said azimuthal direction, and each of said oscillation bodies has a top surface and a base surface opposing to each other and extending substantially parallel to said azimuthal direction, each of said oscillation bodies has a top width along said top surface and a base width along said base surface with respect to said azimuthal direction, and both of the ratio of said top width to said thickness and the ratio of said base width to said thickness are within a range of from 01 to 0.8.

5. Sound converting apparatus as set forth in claim 1, in which each of said oscillation bodies has a base surface extending substantially parallel to said azimuthal direction, and which further comprises a supporting portion extending substantially parallel to said azimuthal direction, and held in contact with said base surfaces of said oscillation bodies to have said oscillation bodies mounted thereon.

6. Sound converting apparatus as set forth in claim 1, in which each of said oscillation bodies has a top surface extending substantially parallel to said azimuthal direction and opposite to said base surface, and which further comprises an acoustic matching layer extending substantially parallel to said azimuthal direction, and held in contact with said top surfaces of said oscillation bodies to be mounted on said oscillation bodies.

7. Sound converting apparatus as set forth in claim 1, in which said oscillation bodies are one-dimensionally aligned one after another in said azimuthal direction for emitting ultrasonic waves converted from said electric signals along a wave propagating direction perpendicular to said azimuthal direction, and each of said electrically conductive bodies is operative to electrically connect two neighboring oscillation bodies.

8. Sound converting apparatus as set forth in claim 1, in which each of said oscillation bodies has a length with respect to a longitudinal direction perpendicular to said azimuthal direction and said wave propagating direction, and said oscillation bodies are aligned one after another in said azimuthal direction and in said longitudinal direction.

9. Sound converting apparatus for performing conversion between electric signals and ultrasonic waves, comprising:

a plurality of oscillation bodies for emitting ultrasonic waves converted from said electric signals along a wave propagating direction; and a plurality of electrically conductive bodies each for electrically connecting said oscillation bodies;

a plurality of signal lines for inputting electric signals to be applied to respective oscillation bodies;

each of said oscillation bodies including a pair of piezoelectric layers respectively having inner surfaces and outer surfaces, extending substantially parallel to said wave propagating direction, said inner surfaces of respective piezoelectric layers opposing to each other;

a pair of external electrodes respectively held in contact with said outer surfaces of respective piezoelectric layers and electrically connected with said electrically conductive bodies; and a dividing electrode sandwiched by and held in contact with said inner surfaces of said piezoelectric layers and electrically connected with said signal line, whereby said piezoelectric layers respectively generate electric polarizations, directions of which are opposing to each other and extending substantially parallel to an azimuthal direction perpendicular to said wave propagating direction, and emit ultrasonic waves converted from said electric signals along said wave propagating direction when electrical fields are applied between said external electrodes and said dividing electrode in response to said electric signals, each of said oscillation bodies has a length with respect to a longitudinal direction perpendicular to said azimuthal direction and said wave propagating direction, and said oscillation bodies are aligned one after another in said azimuthal direction and in said longitudinal direction, and the ratio of said length to said thickness is within a range of from 0.1 to 0.8.

10. Sound converting apparatus as set forth in claim 1, in which said piezoelectric layers are made of a material whose transverse electromechanical coupling coefficient is equal to or more than 35%.

11. Sound converting apparatus as set forth in claim 1, in which said piezoelectric layers are made of a material of lead zirconate titanate ceramics.

* * * * *